(12) United States Patent
Ruh

(10) Patent No.: US 9,983,027 B2
(45) Date of Patent: *May 29, 2018

(54) PROXIMITY SENSOR MODULE WITH LIGHT REFLECTOR

(71) Applicant: Apple Inc., Cupertino, CA (US)

(72) Inventor: Richard Ruh, Monte Sereno, CA (US)

(73) Assignee: Apple Inc., Cupertino, CA (US)

( * ) Notice: Subject to any disclaimer, the term of this patent is extended or adjusted under 35 U.S.C. 154(b) by 240 days.

This patent is subject to a terminal disclaimer.

(21) Appl. No.: 15/001,034

(22) Filed: Jan. 19, 2016

(65) Prior Publication Data

US 2016/0209245 A1    Jul. 21, 2016

Related U.S. Application Data

(63) Continuation of application No. 13/785,852, filed on Mar. 5, 2013, now Pat. No. 9,263,618.

(51) Int. Cl.
| | |
|---|---|
| *H01L 31/167* | (2006.01) |
| *G01D 5/26* | (2006.01) |
| *H01L 31/12* | (2006.01) |
| *G06F 1/16* | (2006.01) |
| *G06F 3/03* | (2006.01) |

(52) U.S. Cl.
CPC ............ *G01D 5/26* (2013.01); *G06F 1/1694* (2013.01); *G06F 3/0304* (2013.01); *H01L 31/125* (2013.01); *H01L 31/167* (2013.01)

(58) Field of Classification Search
CPC ....... G01D 5/26; G06F 1/1694; G06F 3/0304; H01L 31/125; H01L 31/167
See application file for complete search history.

(56) References Cited

U.S. PATENT DOCUMENTS

| | | |
|---|---|---|
| 5,142,416 A | 8/1992 | Nakamura et al. |
| 6,166,370 A | 12/2000 | Sayag |
| 7,714,265 B2 | 5/2010 | Fadell et al. |
| 7,791,015 B2 | 9/2010 | Chen et al. |
| 8,487,256 B2 | 7/2013 | Kwong et al. |
| 9,263,618 B2 * | 2/2016 | Ruh ..................... H01L 31/125 |
| 2003/0094566 A1 | 5/2003 | Hamalainen et al. |
| 2004/0169929 A1 | 9/2004 | Sato et al. |
| 2006/0062512 A1 | 3/2006 | Lee et al. |
| 2009/0139778 A1 | 6/2009 | Butler et al. |
| 2010/0259766 A1 | 10/2010 | Wiese et al. |

(Continued)

*Primary Examiner* — Renee Chavez

(74) *Attorney, Agent, or Firm* — Treyz Law Group, P.C.; G. Victor Treyz; Zachary D. Hadd

(57) ABSTRACT

A proximity sensor may be mounted below a display cover layer in an electronic device. The proximity sensor may have a light source that emits light and a detector configured to detect reflections of the emitted light from nearby external objects. The light emitted from the light source may pass through a lens along an axis towards external objects. The light source and the detector may be mounted in a proximity sensor housing having openings that are aligned with the light source and the detector. A reflector may be mounted to the proximity sensor in a configuration that bridges the opening over the light source. The reflector may be formed from a strip of metal or a strip of prism structures. Some of the light from the light source reflects from the reflector at a non-zero angle with respect to the axis and enhances proximity sensor performance.

20 Claims, 15 Drawing Sheets

(56) References Cited

U.S. PATENT DOCUMENTS

| | | |
|---|---|---|
| 2011/0086676 A1 | 4/2011 | Choi et al. |
| 2011/0121181 A1 | 5/2011 | Costello et al. |
| 2012/0104225 A1 | 5/2012 | McEldowney et al. |
| 2013/0075595 A1 | 3/2013 | Ruh |
| 2013/0153772 A1 | 6/2013 | Rossi et al. |

* cited by examiner

PROXIMITY SENSOR MODULE WITH LIGHT REFLECTOR

This application is a continuation of U.S. patent application Ser. No. 13/785,852, filed Mar. 5, 2013, which is hereby incorporated by reference herein in its entirety. This application claims the benefit of and claims priority to U.S. patent application Ser. No. 13/785,852, filed Mar. 5, 2013.

BACKGROUND

This relates generally to sensors and, more particularly, to proximity sensors for electronic devices.

Some cellular telephones contain proximity sensors. A proximity sensor can detect when a cellular telephone has been brought into proximity to a user's head. When the cellular telephone comes into close proximity to the user's head, touch screen functions in the cellular telephone can be deactivated to avoid unintentional touch input.

A cellular telephone proximity sensor generally contains a light-emitting diode that emits infrared light and a corresponding infrared light sensor that measures the amount of emitted infrared light that is reflected back to the infrared light sensor from the user's head. In some circumstances, such as when a user's hair is dark, the amount of reflected light from the user's head may be relatively small. Unless care is taken, proximity sensor signals will not be sufficiently accurate to properly deactivate a touch screen.

It would therefore be desirable to be able to provide improved proximity sensors for electronic devices.

SUMMARY

A proximity sensor may be mounted below a display cover layer in an electronic device. The proximity sensor may have a light source that emits light and a detector configured to detect reflections of the emitted light from nearby external objects.

The light emitted from the light source may pass through optical structures such as a lens and may travel along an axis towards external objects. The lens may collimate the emitted light or produce emitted light with an angular divergence.

The light source and the detector may be mounted in a proximity sensor housing having openings that are aligned respectively with the light source and the detector. A reflector may be mounted to the proximity sensor in a configuration that bridges the opening over the light source.

The reflector may be formed from a strip of metal, a strip of prism structures, or other structures that direct light in a desired off-axis direction. Light from the light source that reflects from the reflector at a non-zero angle with respect to the axis helps increase reflected signal intensity relative to noise signals and thereby enhances proximity sensor performance.

Further features of the invention, its nature and various advantages will be more apparent from the accompanying drawings and the following detailed description of the preferred embodiments.

DETAILED DESCRIPTION

Figure 1:
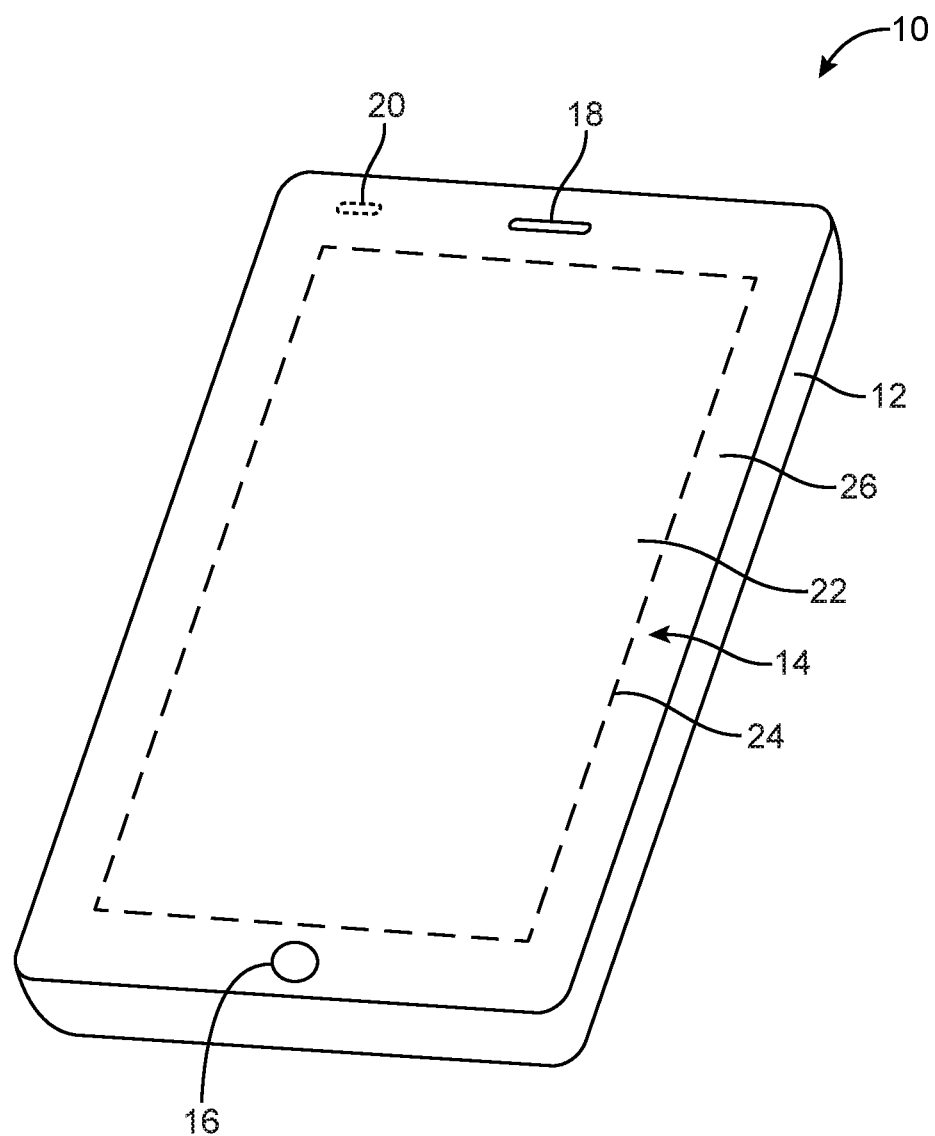
FIG. 1 is a perspective view of an illustrative electronic device with proximity sensor structures in accordance with an embodiment of the present invention.

Electronic devices such as device 10 of FIG. 1 may be provided with proximity sensor components. The proximity sensor components may include light-based proximity sensor components that can be used to make light-based proximity sensor measurements. Proximity sensor data may be used in controlling the operation of device 10. For example, proximity sensor data may be used in controlling touch sensor functions and may be used in controlling other device functions. Device 10 may monitor proximity sensor output during operation of a touch screen and other device features. If the proximity sensor output indicates that an external object such as a user's head is within close proximity to the device, touch sensor functionality may be momentarily deactivated to avoid unintended touch input from the external object.

Device 10 of FIG. 1 may be a portable computer, tablet computer, computer monitor, handheld device, global positioning system equipment, gaming device, cellular telephone, portable computing equipment, or other electronic equipment.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials.

Housing 12 may be formed using a unibody configuration in which some or all of housing 12 is machined or molded as a single structure or may be formed using multiple structures (e.g., an internal frame structure, one or more structures that form exterior housing surfaces, etc.).

In some configurations, housing 12 may be formed using front and rear housing structures that are substantially planar. For example, the rear of device 10 may be formed from a planar housing structure such as a planar glass member, a planar plastic member, a planar metal structure, or other substantially planar structure. The edges (sidewalls) of housing 12 may be straight (vertical) or may be curved (e.g., housing 12 may be provided with sidewalls formed from rounded extensions of a rear planar housing wall). As shown in FIG. 1, the front of device 10 may include a planar display such as display 14 that is covered with a planar cover layer. The cover layer that covers the surface of display 14 may be formed from clear glass, clear plastic, or other transparent materials (e.g., materials that are transparent to visible light and that are generally transparent to infrared light). The cover layer that covers display 14 is sometimes referred to as a display cover layer, display cover glass, or plastic display cover layer.

Display 14 may, for example, be a touch screen that incorporates capacitive touch electrodes or a touch sensor formed using other types of touch technology (e.g., resistive touch, acoustic touch, force-sensor-based touch, etc.). Display 14 may include image pixels formed from light-emitting diodes (LEDs), organic LEDs (OLEDs), plasma cells, electronic ink elements, liquid crystal display (LCD) components, or other suitable image pixel structures.

Display 14 and the cover layer on display 14 may have an active region and an inactive region. Active region 22 of display 14 may lie within rectangular boundary 24. Within active region 22, display pixels such as liquid crystal display pixels or organic light-emitting diode display pixels may display images for a user of device 10. Active display region 22 may be surrounded by an inactive region such as inactive region 26. Inactive region 26 may have the shape of a rectangular ring surrounding active region 22 and rectangular boundary 24 (as an example). To prevent a user from viewing internal device structures under inactive region 26, the underside of the cover layer for display 14 may be coated with an opaque masking layer in inactive region 26. The opaque masking layer may be formed from a layer of ink (e.g., black or white ink or ink of other colors), a layer of plastic, or other suitable opaque masking material.

Device 10 may include input-output ports, buttons, sensors, status indicator lights, speakers, microphones, and other input-output components. As shown in FIG. 1, for example, device 10 may include one or more openings in inactive region 26 of display 14 to accommodate buttons such as button 16 and may include one or more openings such as speaker port opening 18 to accommodate audio components.

Device 10 may include one or more optical components. For example, device 10 may include a light sensor such as visible light sensor that makes measurements on the level of ambient light in the vicinity of device 10. The optical components may also include a light-based proximity sensor. A proximity sensor of this type may emit light and may detect how much of the emitted light is reflected from external objects. Because more light tends to be reflected when external objects are in close proximity to the proximity sensor, the amount of reflected light that is detected by the proximity sensor may be used to determine whether or not external objects are located within the vicinity of the proximity sensor.

A proximity sensor may be mounted on the front or rear surface of device 10, may be mounted on housing sidewalls, or may be mounted in other suitable device locations. With one illustrative arrangement, which is sometimes described herein as an example, a proximity sensor may be located under a portion of inactive region 26. The proximity sensor may, for example, be located under region 20 of inactive region 26. Region 20 may be formed from an opening or other window in inactive region 26.

The proximity sensor may include an infrared light emitter and an infrared light detector. A infrared-transparent material such as "infrared ink" that tends to block visible light while allowing infrared light to pass may be used to cover region 20 (i.e., a proximity sensor window may be formed in region 20 by creating an opening in an opaque masking layer in region 26 and by filling the opening with a layer of infrared-transparent ink).

Figure 2:
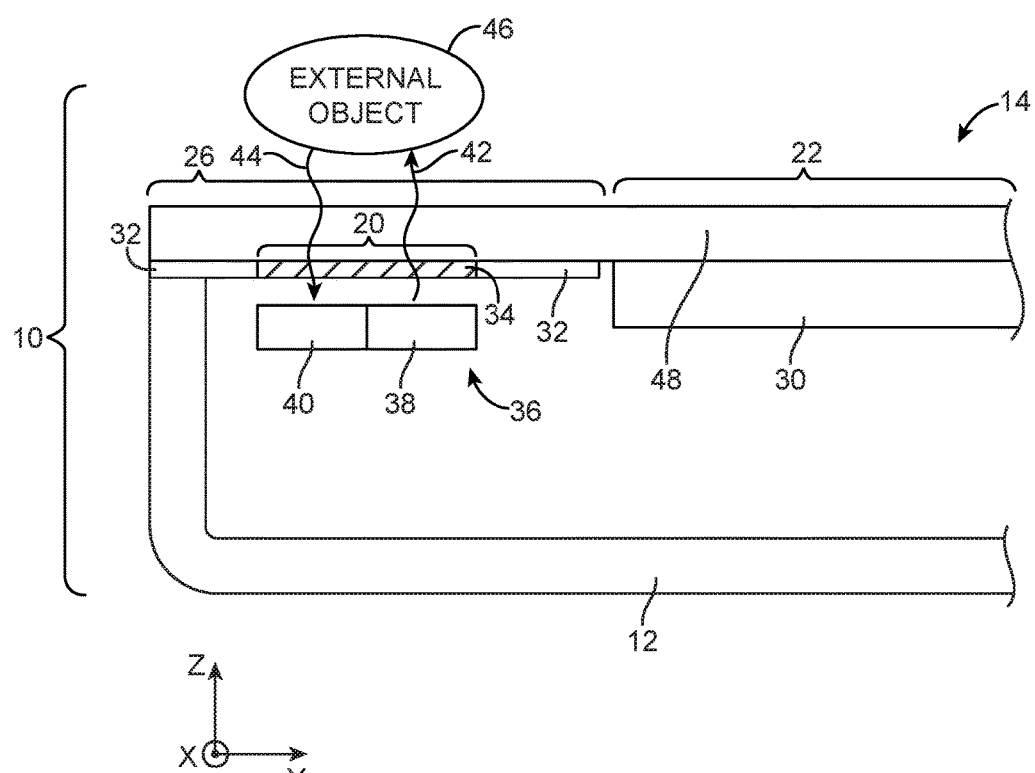
FIG. 2 is a cross-sectional side view of a portion of an electronic device showing where proximity sensor structures and a proximity sensor window for the proximity sensor structures may be formed in accordance with an embodiment of the present invention.

A cross-sectional side view of device 10 in the vicinity of proximity sensor window 20 is shown in FIG. 2. As shown in FIG. 2, display 14 of device 10 may include display structures that generate images such as display module 30. Display module 30 may be an organic light-emitting-diode display module, a liquid crystal display module, or other display structures for generating visible images for a user of device 10. Display module 30 may be mounted within housing 12 (e.g., on the front surface of device 10). Display module 30 may, if desired, include a touch sensor array such as a capacitive touch sensor array or a touch sensor formed using other touch technologies.

Display module 30 may be covered with a cover layer such as cover layer 48. Cover layer 48 may be formed from a clear layer of plastic, a clear (transparent) glass layer, or other suitable transparent layer. The underside of cover layer 48 in inactive region 26 may be provided with an opaque masking layer such as opaque masking layer 32. Opaque masking layer 32 may be formed from a material that is opaque at visible wavelengths such as black ink, black plastic, ink or plastic with other colors (blue, silver, white, etc.), or other suitable opaque material. Opaque masking layer 32 may help block interior device components such as proximity sensor 36 from view through layer 48 by a user of device 10. In active region 22 of display 14, cover layer 48 may be free of opaque masking layer material.

Proximity sensor window 20 may be formed by creating an opening in opaque masking layer 32 and filling the opening with a layer of material such as infrared ink 34 that is able to block at least some visible light while allowing infrared light to be transmitted. Other types of schemes may be used for mounting proximity sensor 36 within housing 12 if desired. The use of an infrared-light-compatible proximity sensor window in opaque masking layer 32 on the underside of a transparent planar member such as display cover layer 48 is merely illustrative.

Proximity sensor 36 may include a light source such as light source 38 and a light detector such as light detector 40. Light source 38 may be, for example, an infrared light-emitting diode that emits light 42. Light 42 may pass through proximity sensor window 20 and the material of cover layer 48. Upon striking the head of a user of device 10 or other external object 46, light 42 may be reflected off of the object, as shown by reflected light 44 in FIG. 2.

Reflected light 44 may be detected using a light detector in proximity sensor 36 such as light detector 40. Light detector 40 may be, for example, a silicon photosensor. By measuring the magnitude of the reflected light signal, proximity sensor 36 may be used to determine whether external object 46 is in the proximity of device 10. For example, the magnitude of reflected light 44 may be compared to a threshold level or may be otherwise processed to ascertain whether external object 46 is sufficiently close to display 14 to warrant actions such as temporary deactivation of the touch sensor functions of display 14.

Light source 38 and light detector 40 may be housed in a common package (e.g., a housing formed from plastic and/or metal), may be formed from separately packaged devices that are mounted to a common substrate (e.g., a printed circuit substrate formed from a rigid printed circuit board material such as fiberglass-filled epoxy or a flexible printed circuit substrate material such as a sheet of polyimide or other flexible polymer), or may otherwise be mounted within housing 12.

The pattern in which light 42 is emitted from device 10 can affect the performance of sensor 36. If light 42 diverges too rapidly, the amount of reflected light 44 will tend to be low. Satisfactory reflected light may be obtained when transmitting light 42 in a collimated light beam (i.e., a light beam with parallel rays) or in a slightly diverging beam (e.g., a beam that exhibits an angular spread of less than 40°, less than 20°, or less than 10°).

Figure 3:
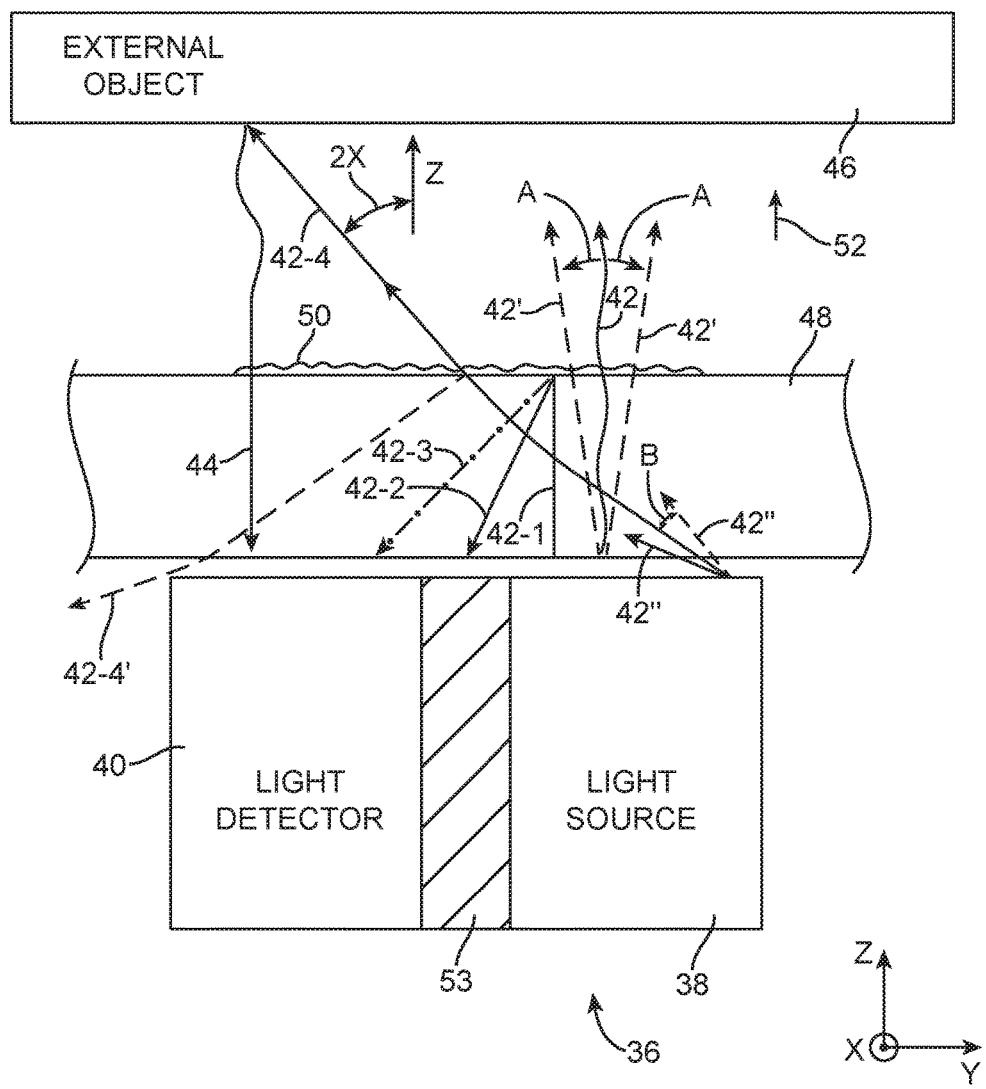
FIG. 3 is a cross-sectional side view of a proximity sensor structure in which optical structures are being used to collimate emitted light and reflect light at an angle in accordance with an embodiment of the present invention.

FIG. 3 is a cross-sectional side view of proximity sensor 36 mounted adjacent to display cover layer 48 in an electronic device. As shown in FIG. 3, light 42 may be emitted vertically (parallel to axis Z) along vertical axis 52. Light 42 may travel along axis 52 towards external objects. Axis 52 may serve as a surface normal for the surfaces of display cover glass 48 and may therefore be perpendicular to both the upper and lower surfaces of display cover glass 48. Light 42 may be emitted in a collimated pattern or may be emitted from light source 38 that emits some of light 42 with an angular spread A that is dictated by the type of light-emitting diode or other component that is used for implementing light source 38 and the optical structures that focus the light from the light-emitting diode (see, e.g., light 42'). As an example, portions of light 42 may have an angular spread A of about 0-40° as the light exits light source 38.

Light 42 that is traveling vertically upwards may reflect off of external object 46 and be detected as reflected light 44 by light detector 40. Skin oils and other surface contaminants 50 may form a coating on the surface of display cover layer 50. These contaminants may tend to reflect light from light source 38 back into light detector 40 without exiting display cover layer 48 and striking external object 46. Consider, as an example, light 42-1, which is scattered by surface contaminants 50. Some of the scattered light such as light ray 42-2 will be blocked by portions of proximity sensor housing structure 53 and will not reach light detector 40. However, other scattered light rays such as scattered light ray 42-3 will be received by light detector 40.

Light such as illustrative light 42-3 of FIG. 3 represents a source of crosstalk that degrades proximity sensor performance when present. Increasing the power of emitted light from light source 38 will increase crosstalk from rays such as rays 42-3 proportionally, so merely increasing output power will not eliminate this potential source of noise in the proximity sensor.

Light source 38 preferably includes light reflecting structures that reflect some of the vertically traveling emitted light along angled paths towards external object 46. For example, light source 38 may contain optical structures that direct some of light 42 exiting light source 38 vertically in direction Z at an angle 2X with respect to vertical axis Z, as indicated by angled light ray 42-4. Because light 42-4 travels at a greater angle through surface contaminant layer 50, reflections 42-4' from this layer fall outside the entrance aperture of light detector 40 as shown in FIG. 3 and so do not contribute to unwanted crosstalk signals. The portion of light 42-4 that is not reflected off of contaminants 50 or the top surface of display cover layer 48 reaches external object 46 and reflects favorably back into the detector as ray 44. As described in connection with FIG. 4, light redirecting features 68 of FIG. 4 increase the amount of favorable signal compared to a device without such light redirecting features. Angled light 42-4 may be characterized by an angular spread of angle B, as shown by light rays 42".

Figure 4:
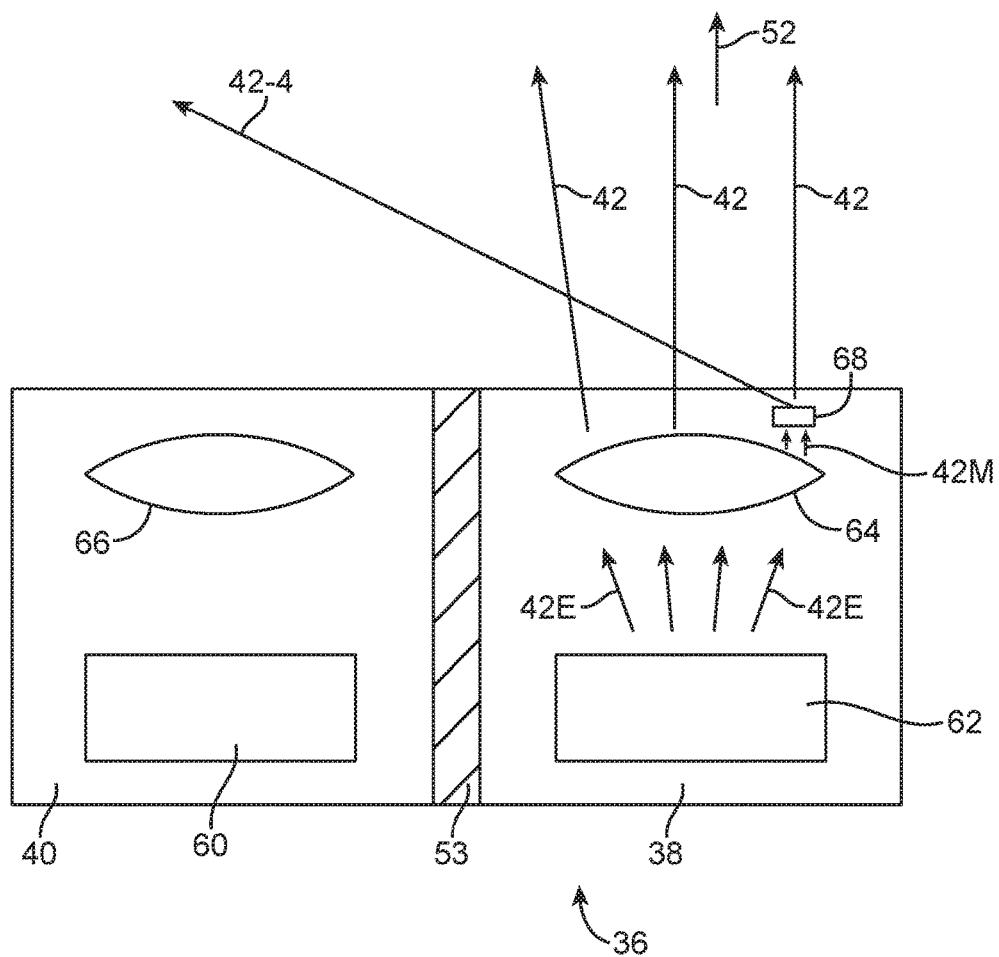
FIG. 4 is a cross-sectional side view of a proximity sensor structure having a light source with optical structures that emit light vertically upwards and that direct a portion of emitted light at a non-zero angle with respect to the vertically propagating light in accordance with an embodiment of the present invention.

Cover layer 48 may lie in the x-y plane. As shown in FIG. 4, light source 38 has a lens or other optical structures 64 that may be used to modify the angular spread of light 42. For example, optical structures 64 may be based on a lens or other structures that collimate light or that otherwise refract or direct light 42E that is emitted from light-emitting diode 62 within light source 38 to produce emitted light 42. The light exiting lens 64 may diverge slightly or may be collimated light that propagates substantially parallel to axis 52 as shown in the example of FIG. 4. Some of the light exiting lens 64 such as light 42M may be directed away from vertical axis 52 by optical structures 68 as angled light 42-4.

Optical structures 68 may direct light 42M along the path of ray 42-4 by reflection (as an example), so optical structures 68 may sometimes be referred to as light reflecting structures or a reflector.

Light 44 that has been reflected from an external object may be received by light sensor 60 through a lens or other optical structure 66 in light detector 40. Light sensor 60 may be a semiconductor detector such as a silicon photodetector or other light detector device.

Axis 52, which may sometimes be referred to as a vertical axis, may form a surface normal for planar display cover layer 48 and may represent the direction of propagation (propagation axis) of collimated light 42. The angular deviation of the most divergent light rays in collimated light 42 relative to axis 52 and vertical dimension may be relatively small (i.e., A may be less than 10°, less than 4°, or less than 2° in scenarios in which lens 64 is configured to produce collimated light 42).

The use of collimated light in detecting the presence of external object 46 may help avoid undesirable detector noise that might otherwise arise due to reflections of light from cover layer 48 into detector 40 (e.g., angled-light reflections from the uppermost glass-air or plastic-air interface associated 48 and from surface contaminants 50). The exclusive use of collimated light may, however, result in relatively low signal strength for the reflected light signal, particularly when light 42 strikes a dark external object.

In a configuration of the type shown in FIG. 4, angled light 42-4 serves as an additional source of emitted light for detecting the presence of external objects. The angle of light 42-4 may be selected to produce few or no direct reflections from the upper surface of the display cover layer into detector 40 and few or no reflections from surface contaminant layer 50 into detector 40 while increasing reflected light 44 from external object 46 to enhance proximity sensor performance.

Figure 5:
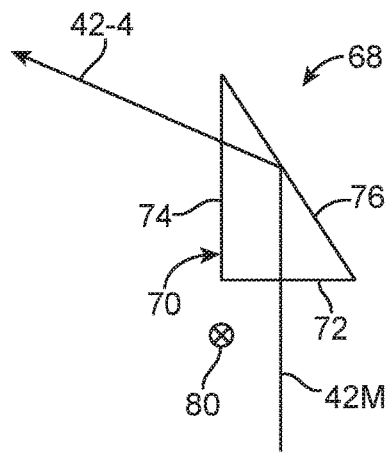
FIG. 5 is a cross-sectional side view of a light reflecting structure based on a prism that may be used to direct a portion of emitted light in a proximity sensor at an angle with respect to vertically propagating light in accordance with an embodiment of the present invention.
Figure 6:
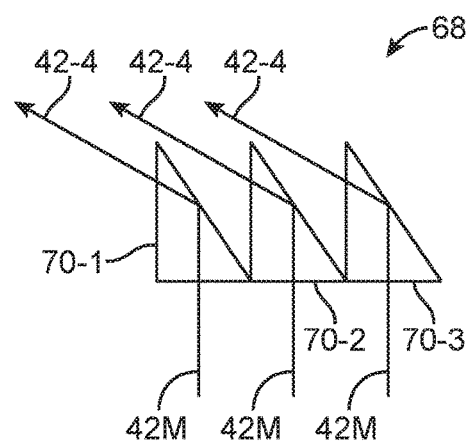
FIG. 6 is a cross-sectional side view of a sawtooth light reflecting structure based on a group of parallel prisms that may be used to direct a portion of emitted light in a proximity sensor at an angle with respect to vertically propagating light in accordance with an embodiment of the present invention.
Figure 7:
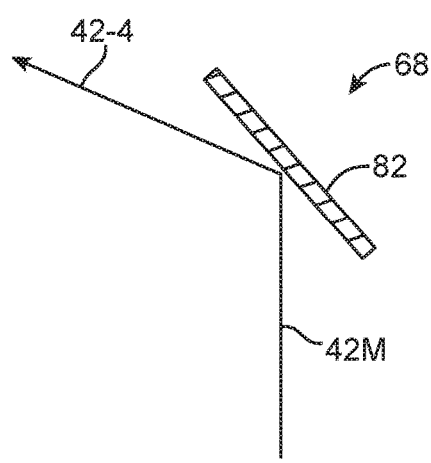
FIG. 7 is a cross-sectional side view of a light reflecting structure based on a mirror that may be used to direct a portion of emitted light in a proximity sensor at an angle with respect to vertically propagating light in accordance with an embodiment of the present invention.

Reflector 68 may be formed from a prism such as prism 70 of FIG. 5. Prism 70 may have a horizontal lower surface through which light 42M is received, an angled (diagonal) surface such as surface 76 from which light is reflected by the principal of total internal reflection, and a vertical surface such as surface 74 through which reflected light such as light ray 42-4 is emitted. Prism 70 may have an elongated shape that runs along axis 80 (into the page in the orientation of FIG. 5). As shown in FIG. 6, light reflecting structures 68 may be formed from multiple parallel prisms such as prisms 70-1, 70-2, and 70-3. These prisms form a sawtooth-shaped structure and are therefore sometimes referred to as forming sawtooth reflection structures or a sawtooth-shaped reflector. FIG. 7 shows how reflector 68 may be formed by mirror 82. Mirror 82 may be formed from metal (as an example).

Figure 8:
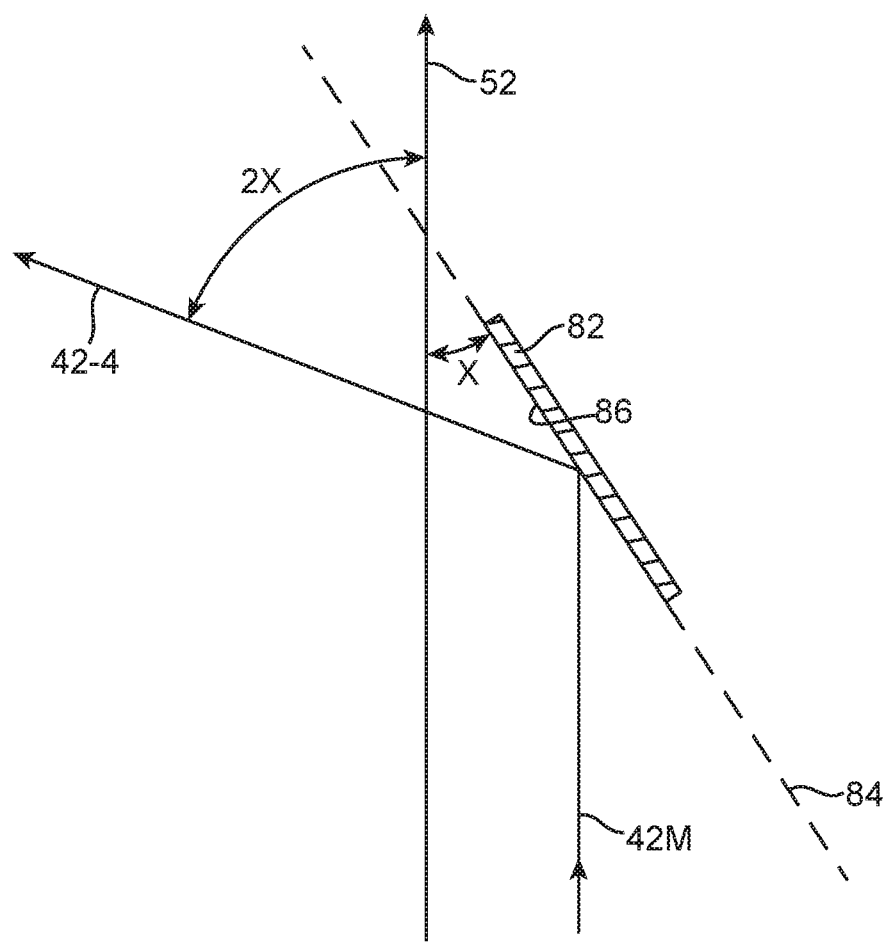
FIG. 8 is a cross-sectional side view of a mirror that is configured to direct a portion of emitted light in a proximity sensor at a given angle with respect to vertical in accordance with an embodiment of the present invention.

As shown in FIG. 8, a reflector (mirror 82 in the example of FIG. 8) may be oriented so that reflective surface 86 lies along angled axis 84. Angled axis 84 and therefore surface 86 of reflector 82 may be oriented at a non-zero angle X with respect to vertical axis 52. Vertically emitted light 42M from light source 38 reflects from surface 86 at an angle X, so that reflected light ray 42-4 makes an angle 2X with respect to vertical axis 52.

Figure 9:
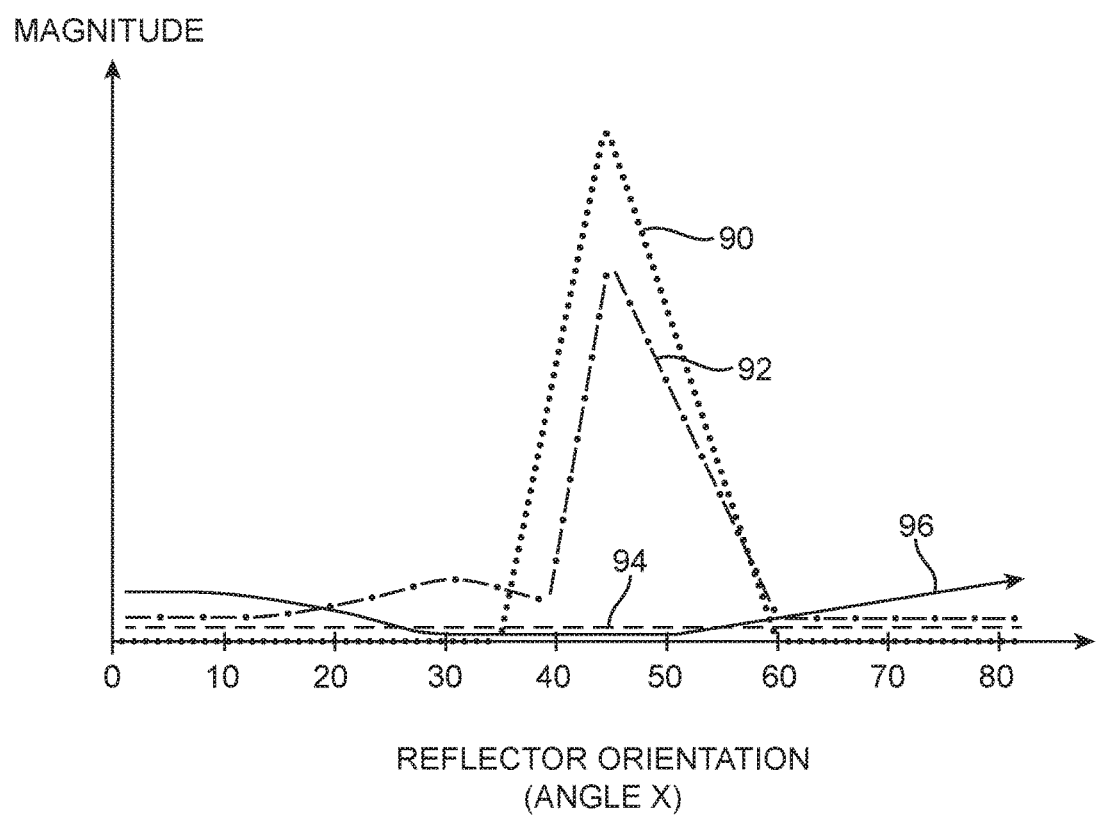
FIG. 9 is a graph containing simulation traces that model how a proximity sensor is expected to perform when measuring dark external objects through a potentially smudged display cover layer over a range of deflection angles for a proximity sensor light reflecting structure in accordance with an embodiment of the present invention.

The angle of X between vertical axis 52 and reflector surface 82 and the resulting angle 2X by which angled reflected light ray 42-4 deviates from vertical axis 52 may be selected using simulations that model proximity sensor performance. A graph in which sensor performance has been simulated is shown in FIG. 9. The FIG. 9 graph contains four traces. The magnitude of dotted line 90 represents how much crosstalk is generated by rays that are emitted by the light source of a proximity sensor and that are reflected directly into the light detector of the proximity sensor by the surface of the cover glass. As shown by the graph of FIG. 9, crosstalk is maximum at about 45°, indicating that this is a poor choice for angle X. The magnitude of dashed-and-dotted line 92 represents the amount of light from the angled light ray that is expected to be reflected from a dark eternal object (e.g., black hair on a user's head) and detected by the light detector. The signal associated with line 92 is the signal that the proximity sensor is trying to detect in order to determine whether or not the user's head is in the vicinity of the proximity sensor. The magnitude of dashed line 94 represents the amount of undesired light reflection expected from surface contamination layer 50. The magnitude of solid line 96 represents a ratio between the undesired smudge signal of line 92 and the desired signal of line 92 (smaller magnitudes of this ratio being better and larger magnitudes being worse). As indicated by line 96, satisfactory angles X for the reflective surface of mirror 82 or other reflectors 68 relative to vertical axis 52 may have values of about 25° to 35° (in this example). Corresponding angle 2X between angled light 42-4 (FIG. 8) and vertical axis 52 may be about 50° to 70°. Other angles may be used for mounting reflector 82 in proximity sensor 36 if desired.

Figure 10:
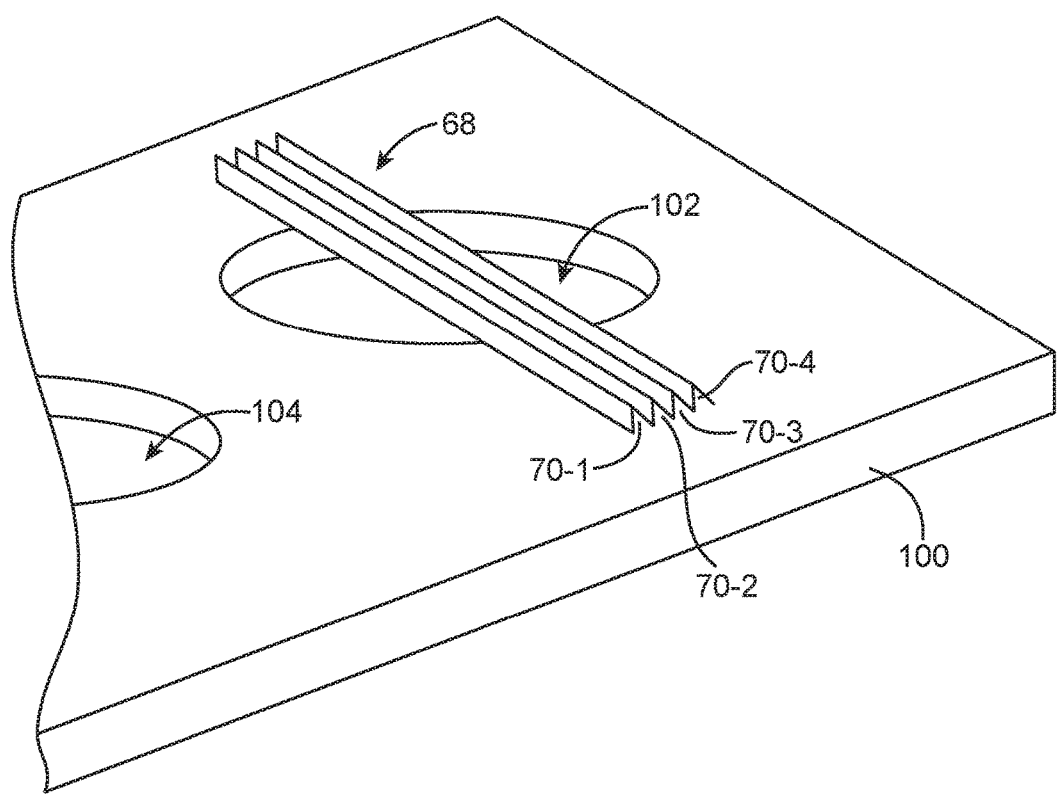
FIG. 10 is a perspective view of a portion of a light source with a sawtooth-shaped light reflecting structure in accordance with an embodiment of the present invention.

FIG. 10 is a perspective view of a portion of a sawtooth-type structure that may be incorporated into a proximity sensor to form reflector 68. As shown in FIG. 10, planar member 10 may have openings such as openings 102 and 104. Member 100 (e.g., a polymer sheet, a portion of a molded plastic structure, or other structure) may be incorporated into proximity sensor 36 so that opening 102 is aligned with light source 38 and so that opening 104 is aligned with light detector 140. Prisms 70-1, 70-2, 70-3, and 70-4 may have elongated shapes that bridge opening 102. Light that is emitted from light source 38 may pass vertically upwards through opening 102. Some of the light that is emitted upwards may strike the sawtooth reflector formed by the prisms and may be reflected at an angle, as described in connection with light 42-4 of FIG. 3 and FIG. 4, thereby enhancing proximity sensor performance, as described in connection with FIG. 9.

Figure 11:
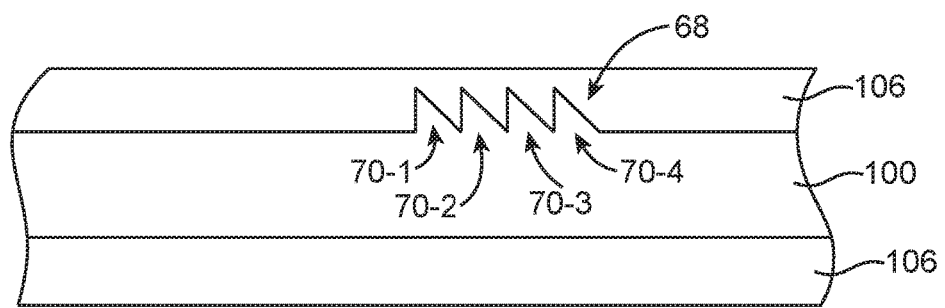
FIG. 11 is a cross-sectional side view of a sawtooth light reflecting member and associated layers of adhesive for mounting the light reflecting structure in a proximity sensor to serve as a light reflecting member in accordance with an embodiment of the present invention.

FIG. 11 is a cross-sectional side view of illustrative proximity sensor member 100 of FIG. 10 in a configuration in which proximity sensor member 100 has been sandwiched between two layers of adhesive 106. Adhesive such as adhesive 106 may be used in attaching member 100 and reflector 68 to the top surface of a proximity sensor housing, may be used in attaching member 100 and the rest of proximity sensor 36 to the inner surface of display cover layer 48, or may otherwise be used in mounting reflector 68 and proximity sensor 36 within device 10. If desired, the lower layer of adhesive 106 may be omitted (e.g., when forming reflector 68 as part of a plastic member that forms a housing for sensor 36 or that is mounted to a housing for sensor 36).

Figure 12:
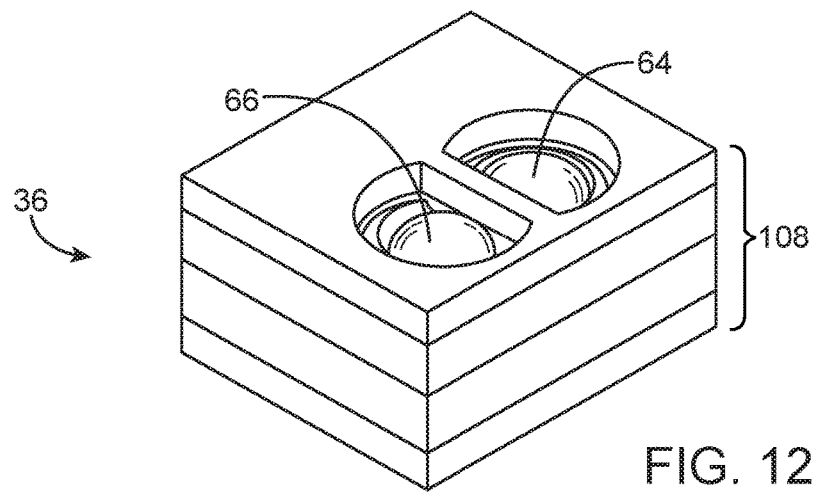
FIG. 12 is a perspective view of a light-based proximity sensor having a light source and light detector mounted within a common housing in accordance with an embodiment of the present invention.

FIG. 12 is a perspective view of an illustrative proximity sensor body that may be used for proximity sensor 36. As shown in FIG. 12, proximity sensor body 108 may have the shape of a cube with openings to allow light to exit light source lens 64 and to allow light to enter light detector lens 66. Proximity sensor body 108 may be formed from one or more structures such as plastic structures (e.g., injection molded plastic structures), metal structures, glass structures, ceramic structures, etc.

Figure 13:
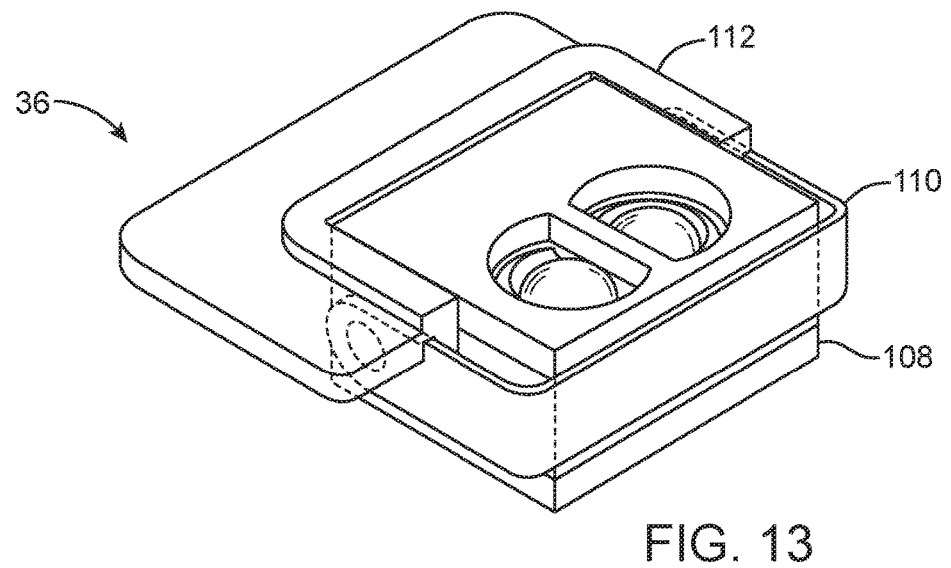
FIG. 13 is a perspective view of the light-based proximity sensor structure of FIG. 12 following attachment of a metal bracket and overmolded plastic structures in accordance with an embodiment of the present invention.
Figure 14:
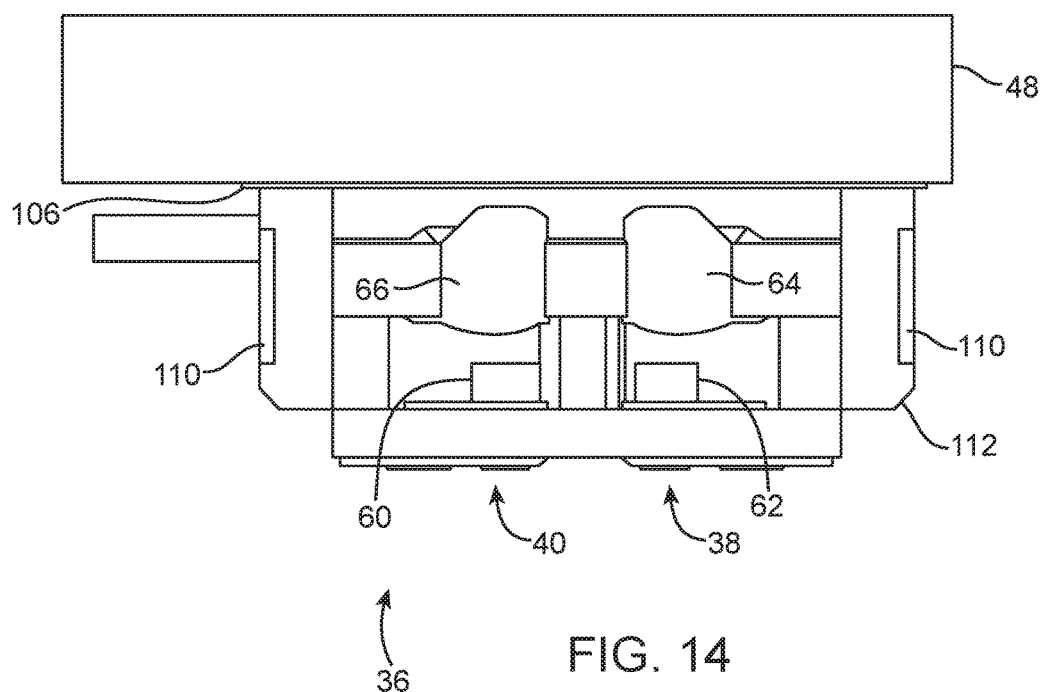
FIG. 14 is a cross-sectional side view of an illustrative proximity sensor of the type shown in FIG. 13 after mounting of the proximity sensor to the underside of a display cover layer in accordance with an embodiment of the present invention.

FIG. 13 is a perspective view of proximity sensor 36 following attachment of additional housing structures to body portion 108 of the proximity sensor housing such as metal band (bracket) 110 and plastic bracket 112 (e.g., a clear plastic bracket). Structures such as structures 110 and 112 may be used in mounting proximity sensor 36 within device 10. As shown in the cross-sectional side view of FIG. 14, for example, adhesive 106 may be used in attaching bracket 112 to the inner surface of display cover layer 48.

Figure 15:
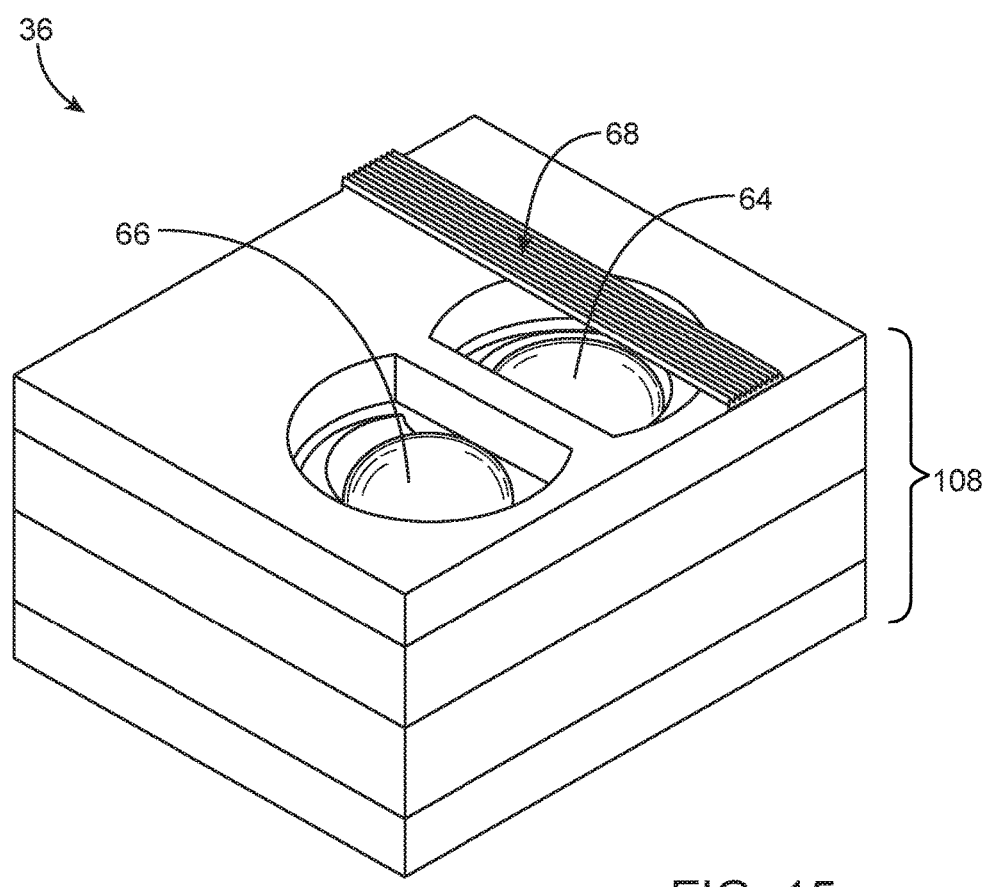
FIG. 15 is a perspective view of a light-based proximity sensor structure having a light source and light detector mounted within a common housing and having a strip of sawtooth reflector structures mounted above the light source to reflect light at an angle from the main axis along which emitted light travels in accordance with an embodiment of the present invention.

FIG. 15 is a perspective view of proximity sensor body 108 in a configuration in which light reflector 68 (e.g., a light reflector formed from a series of parallel prisms such as prisms 70-1, 70-2, . . . of FIG. 10) bridges a portion of the opening in body 108 that covers light source lens 64.

Figure 16:
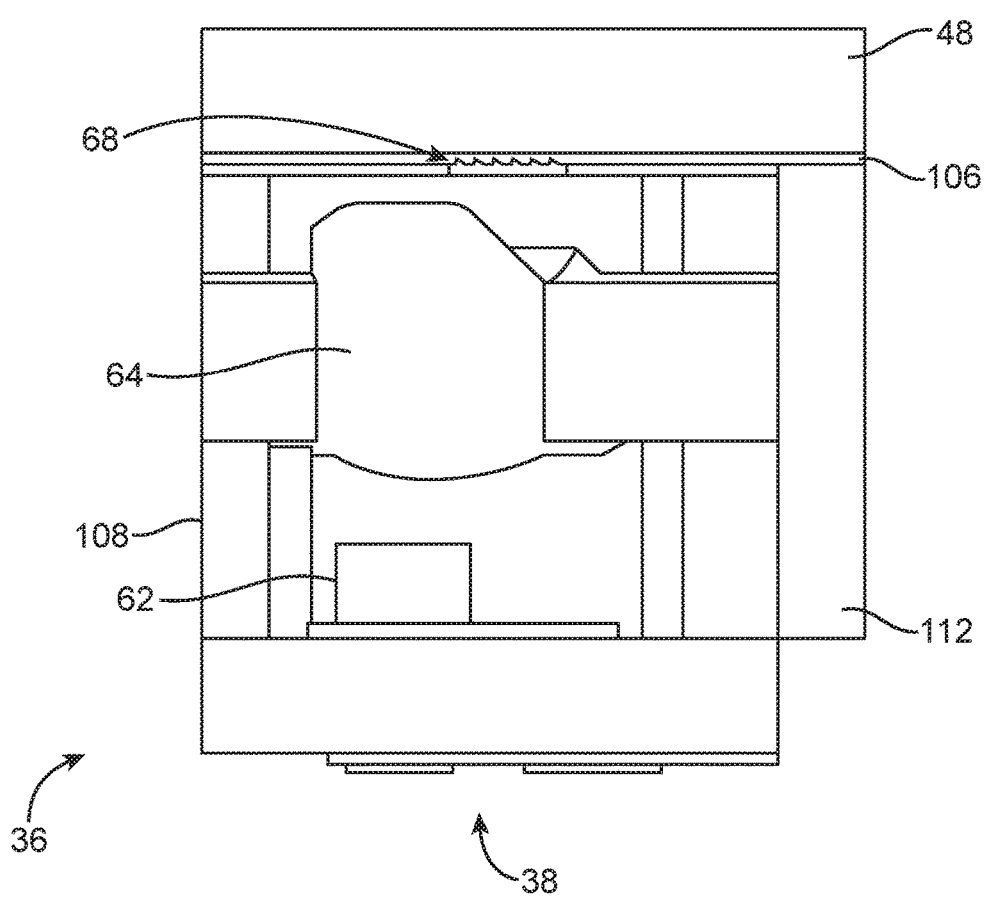
FIG. 16 is a cross-sectional side view of a portion of an illustrative light-based proximity sensor showing how a strip of sawtooth reflector structures may be used in reflecting light in accordance with an embodiment of the present invention.

FIG. 16 is a cross-sectional side view of a portion of proximity sensor 36 in an illustrative configuration in which adhesive 106 has been used in attaching a sawtooth shaped prism-based reflector (reflector 68) to the underside of display cover layer 48. Sawtooth reflector 68 may be formed from a planar plastic member that is attached to the underside of display cover layer 48 with a first layer of adhesive 106 and that is attached to the upper surface of proximity sensor housing member 108 with a second layer of adhesive 106 (see, e.g., sawtooth reflector 68 of FIG. 11) or may be formed as an integral portion of plastic member 112 that is attached to the underside of display cover layer 48 with adhesive 106 (as examples). Other configurations for mounting sawtooth reflector 68 over a portion of lens 64 and the corresponding opening in housing body 108 may be used if desired. The arrangement of FIG. 16 is merely illustrative.

Figure 17:
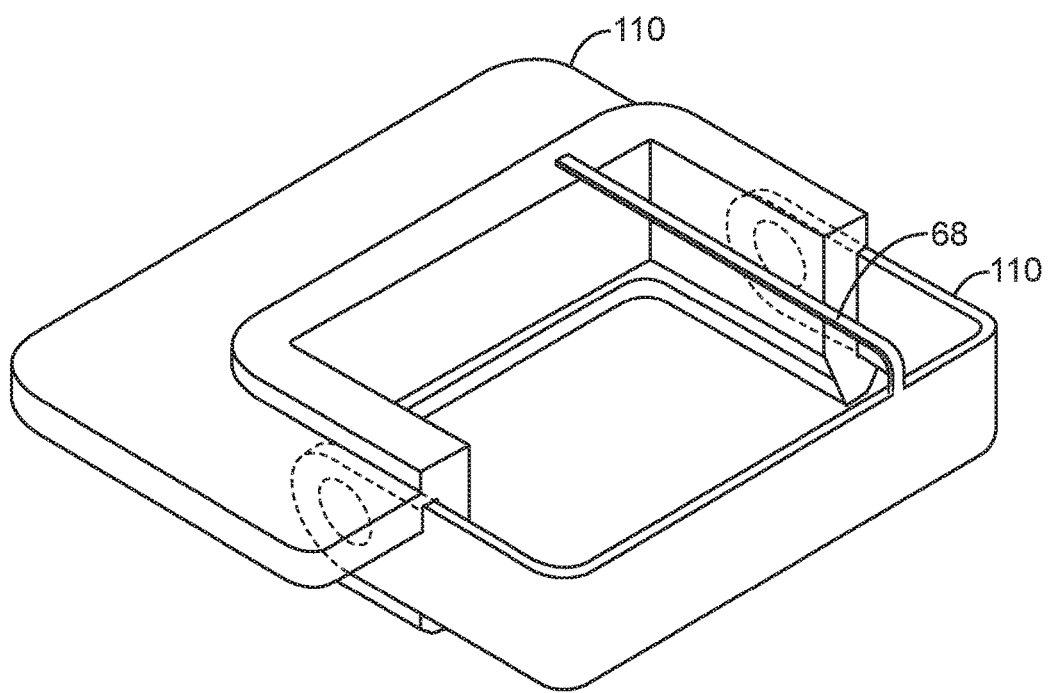
FIG. 17 is a perspective view of a metal bracket and overmolded plastic structures of the type that may be configured to form a strip-shaped metal reflector for a proximity sensor in accordance with an embodiment of the present invention.

FIG. 17 shows how reflector 68 may be formed from an elongated metal structure such as a strip of metal that is an integral portion of metal bracket 110. The strip of metal in FIG. 17 is bent so that its flat surface serves as reflecting surface 86 of reflector 82 in FIG. 8. The angle X of the plane of surface 86 with respect to vertical axis 52 may be about 25° to 35° (as an example).

Figure 18:
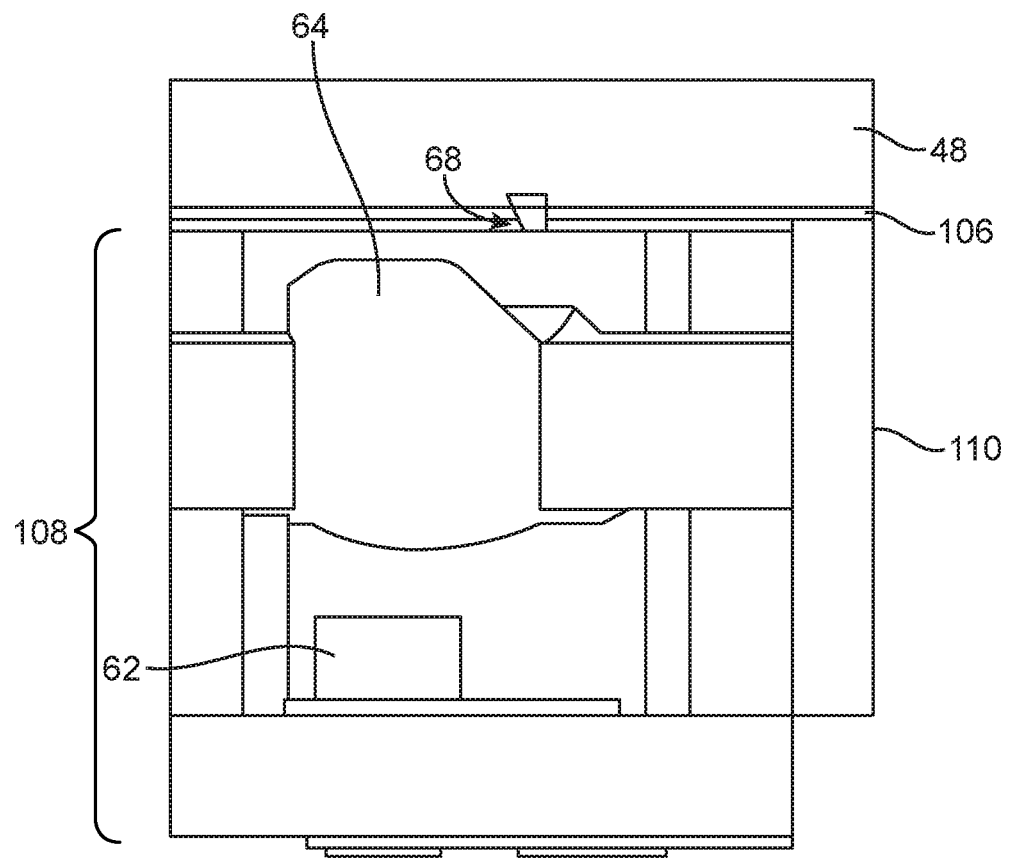
FIG. 18 is a cross-sectional side view of a portion of an illustrative light-based proximity sensor showing how a strip of metal of the type shown in FIG. 17 may be used in reflecting light in accordance with an embodiment of the present invention.

FIG. 18 is a cross-sectional side view of a portion of proximity sensor 36 in which reflector 68 has been formed from an integral portion of bracket 110. Reflector 68 may extend into the page (in the orientation of FIG. 18) so as to bridge lens 64 and the opening in proximity sensor housing 108 that accommodates light from lens 64. Adhesive 106 may be used in attaching bracket 110 to the underside of display cover layer 48.

The foregoing is merely illustrative of the principles of this invention and various modifications can be made by those skilled in the art without departing from the scope and spirit of the invention.

What is claimed is:

1. Apparatus, comprising:
  a light source and a light detector that form part of a light-based proximity sensor; and
  optical structures for the light-based proximity sensor, wherein the optical structures include a lens that directs light from the light source along an axis onto an external object, and wherein the optical structures include a reflector that extends over a gap between the lens and the reflector and that reflects a portion of the light from the light source onto the external object at a non-zero angle relative to the axis.

2. The apparatus defined in claim 1 further comprising:
  proximity sensor housing structures in which the light source and the lens are mounted; and
  a clear bracket that wraps at least partially around the proximity sensor housing structures.

3. The apparatus defined in claim 2, wherein the reflector is formed from the clear bracket.

4. The apparatus defined in claim 2 further comprising:
  a metal bracket that wraps at least partially around the proximity sensor housing structures, wherein the metal bracket overlaps the clear bracket on opposing sides of the proximity sensor housing structures.

5. The apparatus defined in claim 4, wherein the reflector is formed from the metal bracket.

6. The apparatus defined in claim 1 further comprising:
  a display cover layer that defines a plane, wherein the proximity sensor and the optical structures are mounted beneath the display cover layer, and wherein the axis is substantially orthogonal to the plane.

7. The apparatus defined in claim 6, wherein the light that is directed along the axis by the lens and the portion of the light that is reflected at the non-zero angle by the reflector pass through the display cover layer onto the external object.

8. The apparatus defined in claim 6 further comprising:
  a layer of adhesive interposed between the reflector and the display cover layer that attaches the reflector to the adhesive.

9. The apparatus defined in claim 1, wherein the reflector is configured to reduce crosstalk between the light source and the light detector.

10. An electronic device, comprising:
  an electronic device housing;
  a display in the electronic device housing;
  a display cover layer that covers the display; and
  a proximity sensor mounted under a portion of the display cover layer, wherein the proximity sensor has a light source that emits light, a light detector, a lens, and a reflector that bridges the lens, wherein a first portion of the light passes through the lens and travels along an axis perpendicular to the display cover layer, wherein a second portion of the light reflects off of the reflector and travels away from the axis at a non-zero angle, and wherein the first and second portions of the light are received at the light detector through the display cover layer.

11. The electronic device defined in claim 10, wherein the reflector is configured to reduce crosstalk between the light source and the light detector.

12. The electronic device defined in claim 10 further comprising:
  a metal band that at least partially surrounds the proximity sensor.

13. The electronic device defined in claim 12 further comprising a plastic proximity sensor bracket to which the metal proximity sensor bracket is attached, wherein the plastic proximity sensor bracket at least partially surrounds the proximity sensor.

14. The electronic device defined in claim 13 wherein the reflector comprises a strip of metal formed from the metal band and that extends substantially parallel to a plane defined by the display cover structure.

15. The electronic device defined in claim 13 wherein the reflector comprises a prism formed from the plastic proximity bracket and that extends substantially parallel to a plane defined by the display cover structure.

16. The electronic device defined in claim 10, wherein the first and second portions of the light exit the electronic device through the display cover layer.

17. The electronic device defined in claim 16, wherein the first and second portions of the light exit the electronic device onto an object external to the electronic device that reflects the first and second portions of the light to the light detector through the display cover layer.

18. A proximity sensor, comprising:
- a light source;
- a light detector;
- a lens through which light from the light source travels along an axis;
- a housing in which the light source, light detector, and lens are mounted, wherein the housing has an opening that overlaps the lens; and
- a reflector that extends over the opening, wherein a first portion of the light exits the proximity sensor housing through the opening along the axis and wherein a second portion of the light is reflected by the reflector and exits the proximity sensor housing at an angle to the axis.

19. The proximity sensor defined in claim 18, wherein the housing has a rectangular perimeter defined by peripheral side surfaces that surround the light source, the light detector, and the lens, the proximity sensor further comprising:
- a plastic member that at least partially surrounds first and second opposing peripheral side surfaces of the housing and a third peripheral side surface of the housing; and
- a metal member that at least partially surrounds the first and second peripheral side surfaces of the housing and a fourth peripheral side surface of the housing.

20. The proximity sensor defined in claim 19 wherein the housing comprises an upper surface in which the opening is formed and a lower surface opposite the upper surface, and wherein the peripheral side surfaces are substantially perpendicular to the opposing upper and lower surfaces.

* * * * *